(12) United States Patent
Connell

(10) Patent No.: US 10,921,402 B2
(45) Date of Patent: Feb. 16, 2021

(54) ACTIVE SWITCHING FOR RF SLICE-SELECTING

(71) Applicant: SYNAPTIVE MEDICAL (BARBADOS) INC., Bridgetown (BB)

(72) Inventor: Ian Robert Oliphant Connell, Toronto (CA)

(73) Assignee: Synaptive Medical Inc., Toronto (CA)

( * ) Notice: Subject to any disclaimer, the term of this patent is extended or adjusted under 35 U.S.C. 154(b) by 0 days.

(21) Appl. No.: 16/679,969

(22) Filed: Nov. 11, 2019

(65) Prior Publication Data

US 2020/0072920 A1 Mar. 5, 2020

Related U.S. Application Data

(63) Continuation of application No. 15/681,139, filed on Aug. 18, 2017, now Pat. No. 10,473,737.

(51) Int. Cl.

| G01R 33/36 | (2006.01) |
|---|---|
| G01R 33/483 | (2006.01) |
| G01R 33/54 | (2006.01) |
| G01R 33/341 | (2006.01) |
| G01R 33/48 | (2006.01) |
| G01R 33/44 | (2006.01) |
| G01R 33/34 | (2006.01) |

(52) U.S. Cl.
CPC ....... *G01R 33/3621* (2013.01); *G01R 33/341* (2013.01); *G01R 33/3628* (2013.01); *G01R 33/3664* (2013.01); *G01R 33/3692* (2013.01); *G01R 33/445* (2013.01); *G01R 33/4818* (2013.01); *G01R 33/4833* (2013.01); *G01R 33/54* (2013.01); *G01R 33/34076* (2013.01)

(58) Field of Classification Search
CPC .............. G01R 33/3621; G01R 33/341; G01R 33/3628; G01R 33/3664; G01R 33/3692; G01R 33/445; G01R 33/4818; G01R 33/4833; G01R 33/54; G01R 33/3607; G01R 33/3614
See application file for complete search history.

(56) References Cited

U.S. PATENT DOCUMENTS

| 4,797,617 A * | 1/1989 | Misic ............... G01R 33/34046 324/318 |
|---|---|---|
| 4,881,034 A | 11/1989 | Kaufman et al. |

(Continued)

*Primary Examiner* — Patrick Assouad
*Assistant Examiner* — Demetrius R Pretlow
(74) *Attorney, Agent, or Firm* — Fish & Richardson P.C.

(57) ABSTRACT

A magnetic resonance (MR) imaging system includes a transmit radio frequency (RF) coil assembly comprising multiple capacitor banks each coupled to at least one diode that is characterized by a high breakdown voltage such that when the transmit RF coil assembly applies at least one slice-selecting RF pulse to a portion of a subject placed in the magnet to select a particular slice for MR imaging, the capacitor banks are selectively adjusted to improve an RF transmission characteristics of the RF coil assembly in transmitting the at least one slice-selecting RF pulse. The MR imaging system may further include a receive radio frequency (RF) coil assembly configured to, in response to at least the slice-selecting RF pulse, receive at least one response radio frequency (RF) pulse emitted from the selected slice of the portion of the subject; a housing; a main magnet; gradient coils; and a control unit.

18 Claims, 5 Drawing Sheets

(56) References Cited

U.S. PATENT DOCUMENTS

| | | | |
|---|---|---|---|
| 5,278,506 A | 1/1994 | Schmitt | |
| 5,433,196 A | 7/1995 | Fiat | |
| 5,521,507 A | 5/1996 | Rohan et al. | |
| 5,670,881 A | 9/1997 | Arakawa et al. | |
| 6,075,362 A | 6/2000 | Loncar et al. | |
| 6,366,092 B1* | 4/2002 | Ehnholm | G01R 33/4835 324/300 |
| 7,742,799 B2 | 6/2010 | Mueller et al. | |
| 1,015,181 A1 | 12/2018 | Grodzki et al. | |
| 2005/0134271 A1 | 6/2005 | Zheng et al. | |
| 2007/0285199 A1* | 12/2007 | Okamoto | G01R 33/365 335/296 |
| 2009/0315556 A1 | 12/2009 | Driemel et al. | |
| 2010/0056899 A1 | 3/2010 | Toddes et al. | |
| 2010/0256481 A1* | 10/2010 | Mareci | G01R 33/3692 600/423 |
| 2010/0271022 A1* | 10/2010 | Mitsui | G01R 33/3415 324/309 |
| 2012/0025824 A1 | 2/2012 | Harder et al. | |
| 2012/0032678 A1 | 2/2012 | Vaughan et al. | |
| 2012/0123248 A1 | 5/2012 | Rehwald et al. | |
| 2013/0271144 A1* | 10/2013 | Avdievich | G01R 33/3642 324/322 |
| 2014/0218035 A1* | 8/2014 | Okamoto | G01R 33/3692 324/322 |
| 2015/0130462 A1 | 5/2015 | Paul | |
| 2015/0309139 A1 | 10/2015 | Bachschmidt et al. | |
| 2016/0356870 A1 | 12/2016 | Sun et al. | |
| 2017/0038447 A1 | 2/2017 | Pipe | |
| 2017/0261573 A1 | 9/2017 | Nakamura et al. | |
| 2018/0003787 A1 | 1/2018 | Cloos et al. | |
| 2018/0172785 A1 | 6/2018 | Leussler et al. | |
| 2018/0210044 A1 | 7/2018 | Lin et al. | |
| 2019/0056468 A1 | 2/2019 | Connell | |
| 2019/0353722 A1* | 11/2019 | Stormont | G01R 33/34007 |

\* cited by examiner

ACTIVE SWITCHING FOR RF SLICE-SELECTING

CROSS-REFERENCE TO RELATED APPLICATIONS

This application is a continuation application of and claims priority to U.S. application Ser. No. 15/681,139, filed on Aug. 18, 2017, the entire contents of which are hereby incorporated by reference.

BACKGROUND

The present disclosure relates to magnetic resonance imaging.

SUMMARY

In one aspect, some implementations provide a magnetic resonance (MR) imaging system that includes: a housing having a bore sized and shaped to accommodate at least a portion of a subject therein for MR imaging; a main magnet accommodated by the housing and configured to generate a volume of magnet field suitable for MR imaging over a region located within the bore and covered by the volume of magnetic field; a transmit radio frequency (RF) coil assembly comprising multiple capacitor banks each coupled to at least one diode that is characterized by a breakdown voltage of at least 500 volts such that when the transmit RF coil assembly applies at least one slice-selecting RF pulse to the portion of the subject in the region to select a particular slice for MR imaging, the capacitor banks are selectively adjusted to improve an RF transmission characteristics of the RF coil assembly in transmitting the at least one slice-selecting RF pulse; a receive radio frequency (RF) coil assembly configured to, in response to at least the slice-selecting RF pulse, receive at least one response radio frequency (RF) pulse emitted from the selected slice of the portion of the subject; gradient coils configured to provide perturbations to the volume of magnet field such that the at least one response RF pulse encode an MR image in accordance with the provided perturbations; and a control unit coupled to the transmit RF coil assembly, the receive RF coil assembly, and the gradient coils, the control unit configured to: operate the gradient coils, the transmit coil assembly, and the receive coil assembly such that the at least one slice-selecting RF pulse is synchronously applied along with the perturbations to the volume of the magnet field and that the at least one response radio frequency (RF) pulse is subsequently received.

Implementations may include one or more of the following features.

The at least one diode may be actively switched when a particular slice-selecting RF pulse is applied at a resonant frequency determined by where the particular slice is located in the region.

The multiple capacitor banks may include at least one tuning capacitor bank. The at least one diode may be actively switched such that the transmit radio frequency (RF) coil assembly's resonant frequency is adjusted to be more closely matched to the resonant frequency of the particular slice than otherwise. The at least one tuning capacitor bank may be coupled to direct current (DC) biasing circuits located at a direct current (DC) input configured to receive a DC input. Each of the at least one tuning capacitor bank may be coupled to a particular DC biasing circuit that comprises a RF choke and a DC block. The DC biasing circuits may be coupled to a voltage divider network configured to generate a respective DC voltage for each DC biasing circuit. The voltage divider network may be configured to apply the respective DC voltage in a manner that selectively switches each diode coupled to each tuning capacitor bank without individually biasing each tuning capacitor bank.

The multiple capacitor banks may include at least one matching capacitor bank. The at least one more diode may be actively switched such that the transmit radio frequency (RF) coil assembly's impedance at the resonant frequency of the particular slice is adjusted to be closer to a matching impedance than otherwise. Each matching capacitor bank may be serially coupled to a particular diode to accommodate both an RF input and a DC input on one input power cable, the RF input including the at least one slice-selecting RF pulse, and the DC input driving a voltage divider network. Each of the at least one matching capacitor bank may be coupled to a particular DC biasing circuit that comprises a DC block. Each DC biasing circuit may be coupled to a voltage divider network configured to generate a respective DC voltage for the DC biasing circuit, the voltage divider network comprising RF chokes and a network of resistors.

The at least one diode may be actively switched from on to off. The at least one diode may be actively switched from off to on. The region may include multiple slices along an axial direction of the volume of the magnetic field.

The control unit may be further configured to reconstruct an magnetic resonance (MR) image based on the at least one response radio frequency (RF) pulse.

The MRI system may further include: a display on which the MR image is presented.

In another aspect, some implementations provide a method for operating an MRI system to image a portion of a subject placed in a volume of magnetic field generated by a main magnet of the MRI system, the method including: applying, at a transmit RF coil assembly, at least one slice-selecting RF pulse to the portion of the subject placed in the region of the volume to select a particular slice while actively switching capacitor banks of the transmit coil assembly such that an RF characteristics of the transmit RF coil assembly in transmit the at least one slice-selecting RF pulse is improved; in response to the at least one slice-selecting RF pulse, acquiring magnetic resonance (MR) signals encoding the portion of the subject placed in the region of the volume; and reconstructing an MR image of the portion of the subject based on the acquired MR signals.

Implementations may include one of more of the following features.

The RF characteristics of the RF transmit coil assembly may be improved by virtue of adjusting the transmit RF coil assembly's resonant frequency to be more closely matched to the resonant frequency of the particular slice than before the switching. The RF characteristics of the RF transmit coil assembly may be improved by virtue of adjusting the transmit radio frequency (RF) coil assembly's impedance at the resonant frequency of the particular slice.

The method may further include presenting the reconstructed MR image to an operator.

The details of one or more aspects of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference symbols in the various drawings indicate like elements.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Radio frequency (RF) coils are employed by magnetic resonance imaging (MRI) systems. An example of an RF coil assembly on an MRI system may transmit RF excitation pulses during an MRI imaging sequence so that MR signals may be obtained from a subject and an MR image may be reconstructed based on the MR signals. The transmit RF excitation pulses generally may include a slice-selecting RF pulse that selects a particular slice from the subject for MRI imaging. The slice-selecting RF pulse may be applied at a frequency, on the order of kilohertz, above or below the resonating frequency of the RF coil assembly itself. The slice-selecting RF pulse is generally applied in concert with the application of a gradient waveform through gradient coils that encodes the spatial positions of nuclei of the intended slice from the subject. The encoding may be based on, for example, a set of Fourier-based set coefficients. When this slight shift in frequency is effectuated without adjusting the impedance matching or tuning of the transmit RF coil assembly, an issue can arise for slices located relatively far off, for example, the z-axis gradient isocenter of the magnet of an MRI system. Specifically, the RF pulse frequency may fall outside the efficient transmitting band of the RF coil assembly. Once this happens, more RF power may be needed to maintain the same excitation level in the sample for slices far off the z-axis gradient coil isocenter. To overcome this challenge of maintaining high transmit efficiency across an asymmetric z-axis gradient coil field, an active 'hot switching' method is disclosed that actively tunes the transmit RF coil assembly with a dynamic coil tuning method used in concert with an impedance transformation circuit. This method is capable of tuning the RF coil across the full transmitting bandwidth such that slice-select acquisitions are performed without increasing power requirements of the transmitting system and tissue-independent contrast is reduced.

Figure 1A:
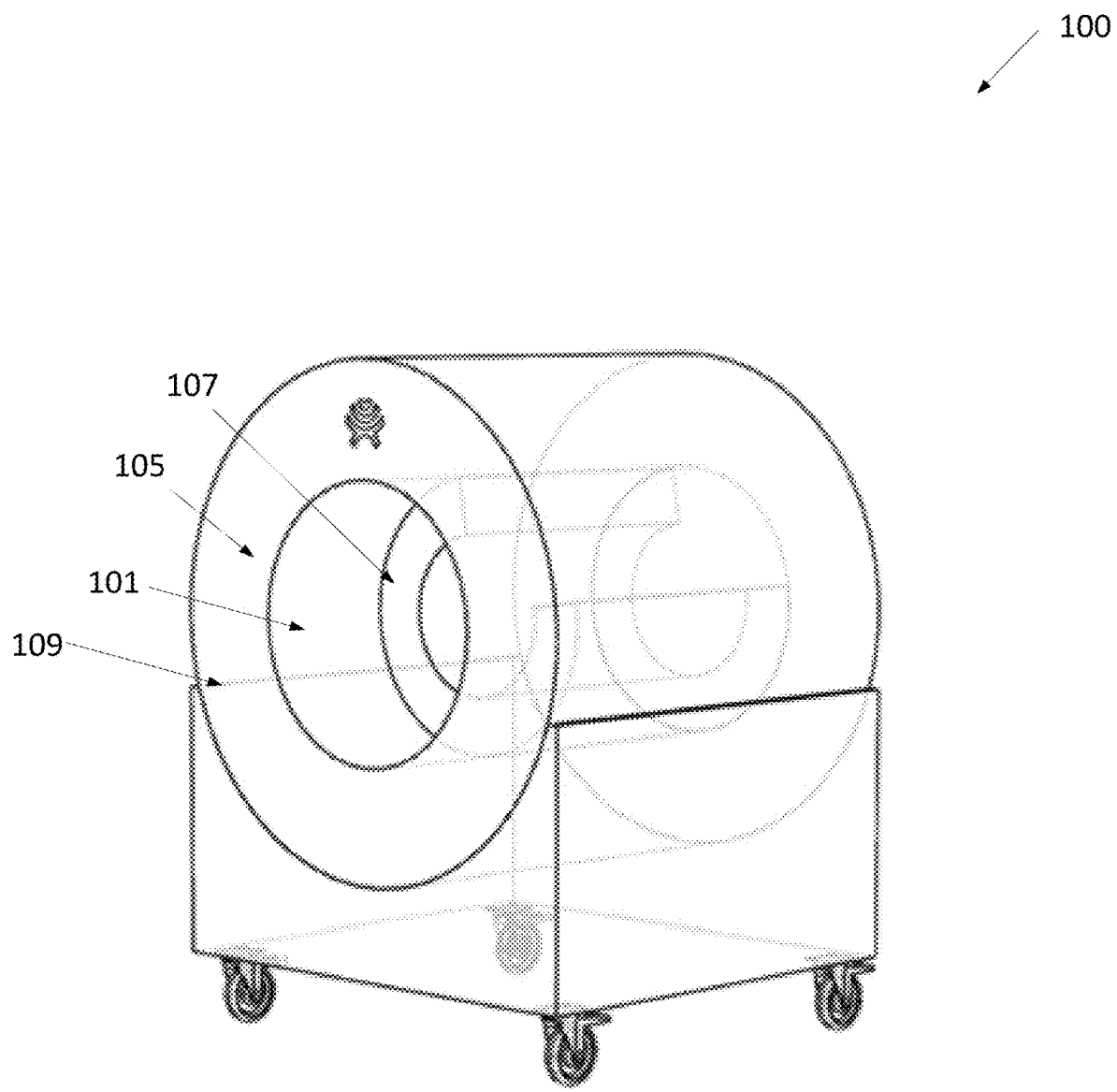
FIG. 1A shows a perspective view of an example of a magnetic resonance imaging (MRI) system with a solenoid magnet.
Figure 1B:
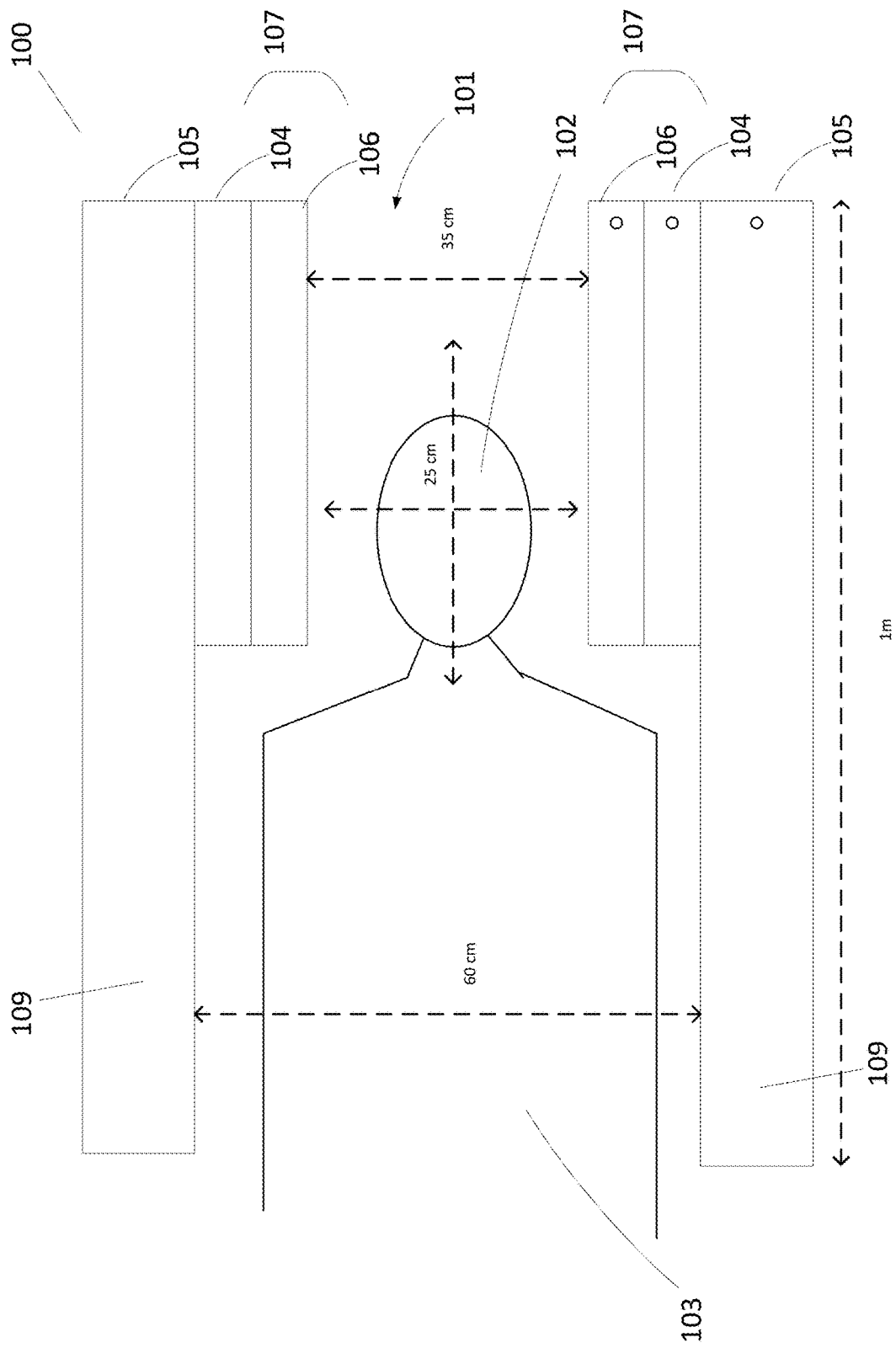
FIG. 1B shows a cross-sectional illustration of the example of a magnetic resonance imaging (MRI) system.

FIGS. 1A-1B show a perspective view and a cross-sectional view of an example of a magnetic resonance imaging (MRI) system 100 in which a solenoid magnet 105 is provided in a cylindrical shape with an inner bore 101. Coil assembly 107, including transmit coil 106 and gradient coil 104, is provided within solenoid magnet 105. Coil assembly 107 may generally be shaped as an annular structure and housed within the inner bore of solenoid magnet 105. In some implementations, annular coil assembly 107 only includes gradient coil 104. Gradient coil 104 generally provides field gradients in more than one directions, such as, for example, all three orthogonal spatial directions. Thus, gradient coil 104 may refer to three sets of coils, each configured to generate field fluctuations in a respective direction for the main field in the inner bore of the solenoid magnet 105. Such field fluctuations may cause magnetizations from various spatial locations to experience precessions at different frequencies, enabling encoding of spatial information of the magnetizations through RF excitation pulses.

Figure 2:
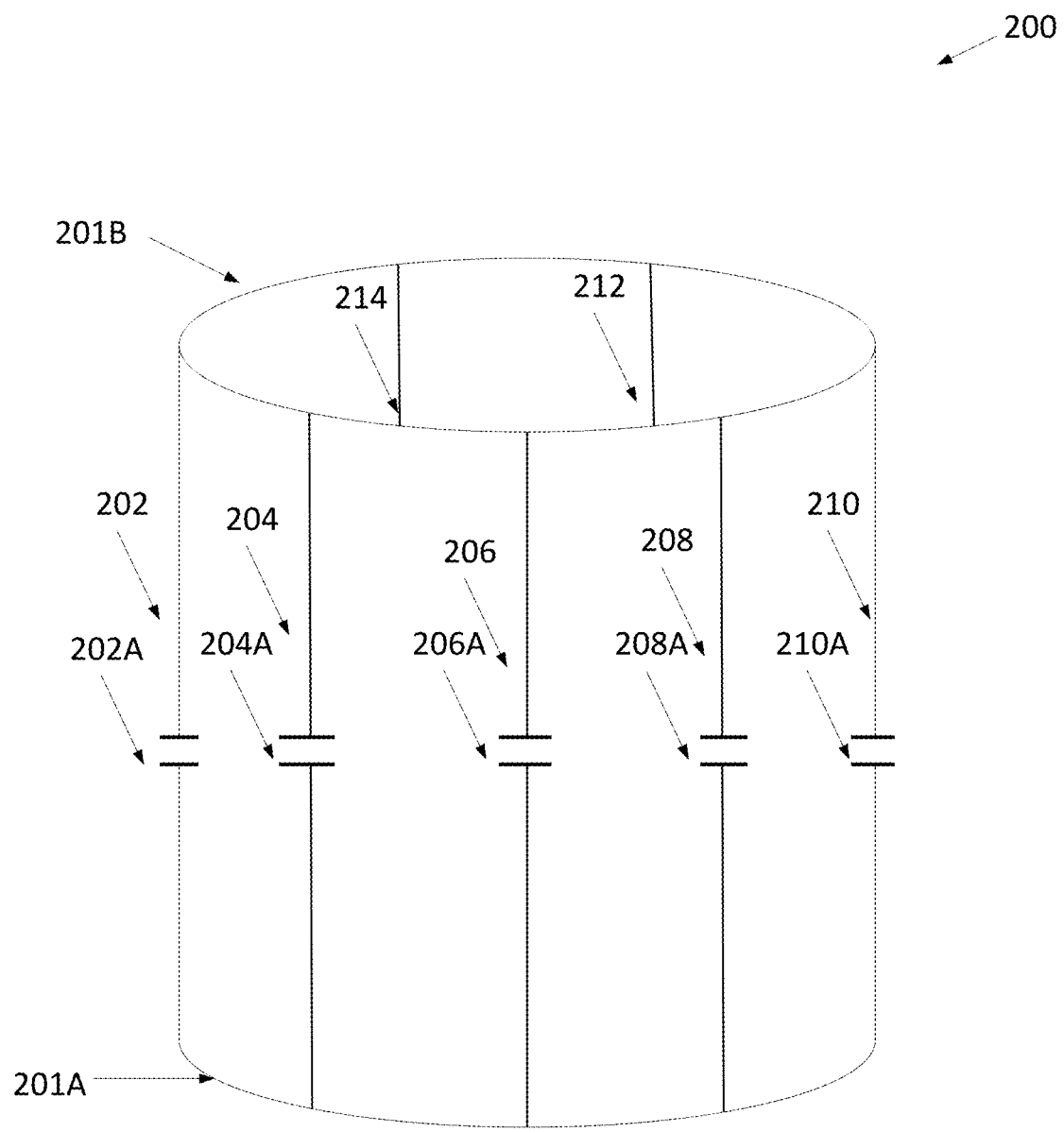
FIG. 2 illustrates an example of coil configured as a transmit radio-frequency (RF) coil assembly.

In these implementations, annular coil assembly does not include transmit coil 106 or any receiver coil. For these implementations, radio-frequency (RF) excitation pulses are, for example, transmitted by local coils for imaging the head region 102 of patient 103. In one instance, a head coil in a birdcage configuration is used for both transmitting RF excitation pulses and receiving MR signals for imaging the subject. An example of a birdcage configuration is shown in FIG. 2, which may be used as a transmit-only RF coil assembly. In this case, a volume coil may be used for transmitting an RF excitation pulse into the subject and a phased array coil configuration is used for receiving MR signals in response.

Referring to FIGS. 1A to 1B, in some implementations, shimming coils 109 are housed within the cylindrical walls of solenoid magnet 105. Shimming coils 109 are powered by a group of power amplifiers. In some cases, the power amplifiers are housed in a control room and are connected to shimming coils 109 to provide shimming of the magnetic field within inner bore 101. In driving shimming coils 109, power amplifiers may be controlled by a control unit that generally includes one or more processors as well as programming logic to configure the power amplifiers. In some instances, the control unit is housed in a control room separate from the solenoid magnet 105 of the MRI system 100. The driving current for shimming coils 109 may be in the range of hundreds of miliamperes and generally may not exceed 1 ampere. Further, shimming coils 109 may not require active cooling using circulating coolant. In these implementations, an array of shimming coils can be used to provide adjustment to the field strength within the inner bore 101 such that the magnet field within the inner bore 101 becomes more homogenous.

The embodiments provided herein may be adapted for intraoperative MRI, and MRI systems for use in an emergency room setting. Such MRI systems may include a smaller and more compact bore size magnet compared to the magnets from conventional whole body scanners. One consequence of a smaller bore magnet is that, the volume of uniform magnetic field suitable for imaging (e.g., with field inhomogeneity below a defined threshold) may not cover all areas of interest. Another consequence of smaller bore operation (or lower field operation, for example, below 1 Telsa) is that the slice-selecting RF pulse may need to be transmitted at the edge or outside an efficient transmission band of the RF coil.

In more detail, the transmit RF coil 106 is a resonant structure that excites the sample during a magnetic resonance imaging (MRI) acquisition. The resonant frequency of the RF coil 106 is tuned to the Larmor frequency for the nuclei of interest and field strength of the MRI scanner 100.

The input impedance of the tuned RF coil is then transformed at the coil input to match the amplifier characteristic impedance (typically 50 Ohm's). FIG. 2 further illustrates an example of coil configured as a transmit radio-frequency (RF) coil assembly 200. This RF coil assembly 200 may include, for example, RF coil 106 shown in FIG. 1B. Although RF coil assembly 200 is configured as a "birdcage" RF coil design, the discussions herein are not limited to the birdcage RF coil design. As illustrated, RF coil assembly 200 includes two circular conductive loops referred to as end rings 201A and 201B connected by conductive straight elements called rungs or legs 202, 204, 206, 208, 210, 212, and 214. The number of rungs may depends on the size of the coil assembly and typically ranges from about 8 to 32. RF coil assembly 200 also contain capacitors 202A, 204A, 206A, 208A, and 210A between conducting elements legs 202, 204, 206, 208, and 210, variably arranged based on the frequency characteristics desired. In clinical MRI a high-pass configuration is generally used with pairs of capacitors located along the end rings. Together this design approximates a continuous conducting surface. In an example of transmit operation, sinusoidal currents are applied to each rung that are sequentially phase shifted around the coil's periphery. If there are N rungs, the phase shift between the currents in neighboring elements is $360°/N$. Under antenna theory, when the current distribution over a cylindrical surface satisfies sinusoidal angular dependence, a resonant condition exists and a homogeneous magnetic field can be created inside the conductor. Yet, each RF transmit coil assembly operates as a resonating structure with a center frequency bandwidth, for example, characterized as full width at half maximum (FWHM).

During an MRI imaging sequence, a slice-selecting RF pulse may be applied through transmit RF coil assembly 200. As discussed herein, the slice-selecting RF pulse is tuned to a frequency where nuclei from the particular slide resonate. Spatially encoding gradient waveforms applied in concert with the slice-selecting RF pulse may determine the resonant frequency of nuclei from the slice being selected. Thus, there can a frequency offset between the lamor frequency of the main magnet and the resonant frequency of the slice-selecting RF pulse. This frequency offset may be more pronounced, on relative terms, at low-field strengths (e.g., below 1 Telsa) when the transmitting bandwidth of the RF coil is on the order of the RF pulse offsets during a given slice-select MRI acquisition. For frequency offset of such magnitude, when slices being selected at located far off the z-axis gradient isocenter (for example, 10 cm or above), the RF pulse frequency falls outside the efficient transmitting pass band of the RF coil assembly, thereby demanding more RF power to maintain the similar or comparable excitation profiles in the sample for slices far off the z-axis gradient coil isocenter. Moreover, MRI systems may incorporate the use of an asymmetric z-axis gradient coil that operates with a z-axis field offset of the gradient field. In these designs, the zero-crossing of the gradient field with respect to the z-axis may not be located along isocenter of the imaging field-of-view (FOV). This misalignment may increase the frequency range across which an RF excitation pulse, including a slice-selecting RF pulse, as applied to the input of the transmit RF coil assembly, should be capable of sweeping to encode individual slices of the imaging region. To overcome this challenge of maintaining high transmit efficiency across an asymmetric z-axis gradient coil field operating at low-field, systems and methods for an active 'hot switching' is disclosed. According to this approach, active tuning of the transmit RF coil assembly can be achieved when dynamic coil tuning is applied along with an impedance transformation circuit. This approach is capable of tuning the transmit RF coil assembly across the full transmitting bandwidth that can be used for slice-select acquisitions without increasing power requirements of the transmitting system while reducing tissue-independent contrast.

The active 'hot-switching' may incorporate the use of high powered RF switches—diodes that are characterized with very high breakdown voltages (for example, 500 voltages above) to accommodate the potentially large swing voltages of the RF pulses during slice selection and excitation phases of an MRI imaging sequence.

Homogeneous, efficient slice selection and excitation utilizing a birdcage RF coil shown in FIG. 2 may demand equal capacitance across each birdcage "leg." To this end, active tuning may be located across each birdcage leg. Using the diode as a switch, several capacitor banks shown in FIG. 3A, placed in series within the legs of the birdcage RF coil, can switch on or off via the application of a direct current (DC) voltage applied across the diodes.

To isolate the DC biasing of the diodes from the RF currents, RF chokes and DC blocks may be implemented at the DC input of the RF coil assembly. To achieve active biasing of several diodes, voltage divider networks may be utilized in parallel with the DC bias circuits and the individual diodes. In this manner, individual diodes can be selectively biased via the application of a single DC voltage. This arrangement may reduce the cabling burden of individually biasing capacitor banks, and may reduce DC current paths through the RF coil.

A tuning capacitor bank may include multiple rows each encompassing tuning capacitors separated by one or mode diodes and the diode(s) of each row may couple to RF chokes and DC block(s). In more detail, an example of a tuning capacitor bank from FIG. 3A includes three rows of tuning capacitor arrangements, namely, tuning capacitors 303A and 303C in the first row, tuning capacitors 304A and 304C in the second row, and tuning capacitors 305A and 305C in the third row. Tuning capacitors 303A and 303C are separated by diode 303B which couples, in a parallel manner, to RF choke 303D and RF choke 303F separated by DC block 303E. Tuning capacitors 304A and 304C are separated by diode 304B which couples, in a parallel manner, to RF choke 304D and RF choke 304F separated by DC block 304E. Tuning capacitors 305A and 305C are separated by diode 305B which couples, in a parallel manner, to RF choke 305D and RF choke 305F separated by DC block 305E. Here, DC voltage 301 is coupled to a voltage divider network that includes resistors 302A, 302B, 302C, and 302D. Through the various nodes between the above resistors, a respective DC bias is thus provided to each capacitor bank row so that a first DC bias is applied to DC block 303E of the first row; a second DC bias is applied to DC block 304E of the second row; and a third DC bias is applied to DC block 305E of the third row. As illustrated, while an RF input may pass all capacitor row in parallel, the DC bias for each capacitor row varies and can thus be dynamically adjusted by virtue of selectively biasing the respective diode in each capacitor row. Indeed, the selective bias can be implemented through a single DC voltage 301. This arrangement can reduce cabling burden of having to individually biasing each capacitor bank. Because the capacitors in each row block DC paths other than those directly across the diode, this arrangement can also reduce DC current paths through the RF coil assembly 200.

Figure 3A:
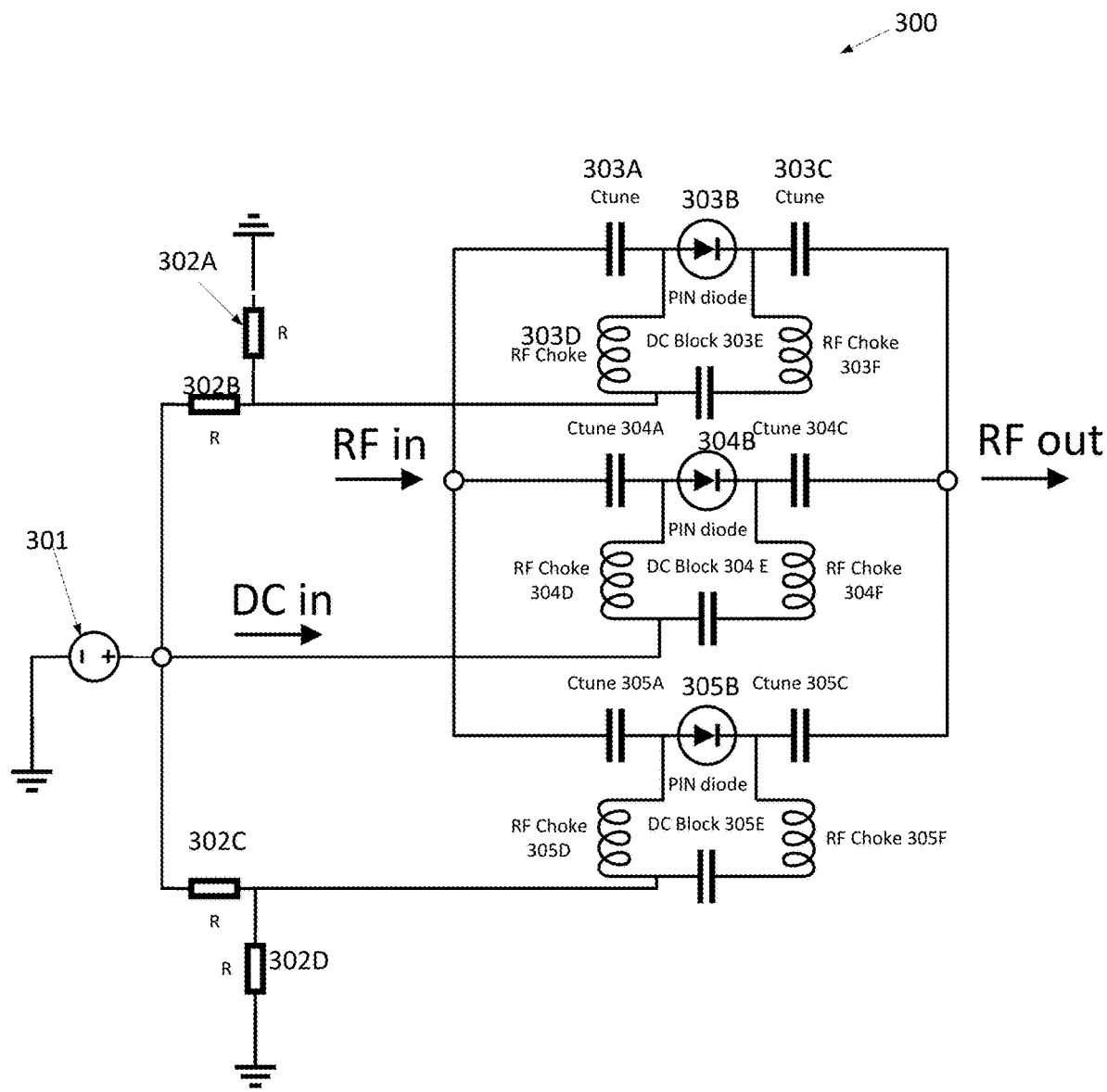
FIG. 3A shows an example of a tuning capacitor bank configured provide tuning to a transmit RF coil assembly.
Figure 3B:
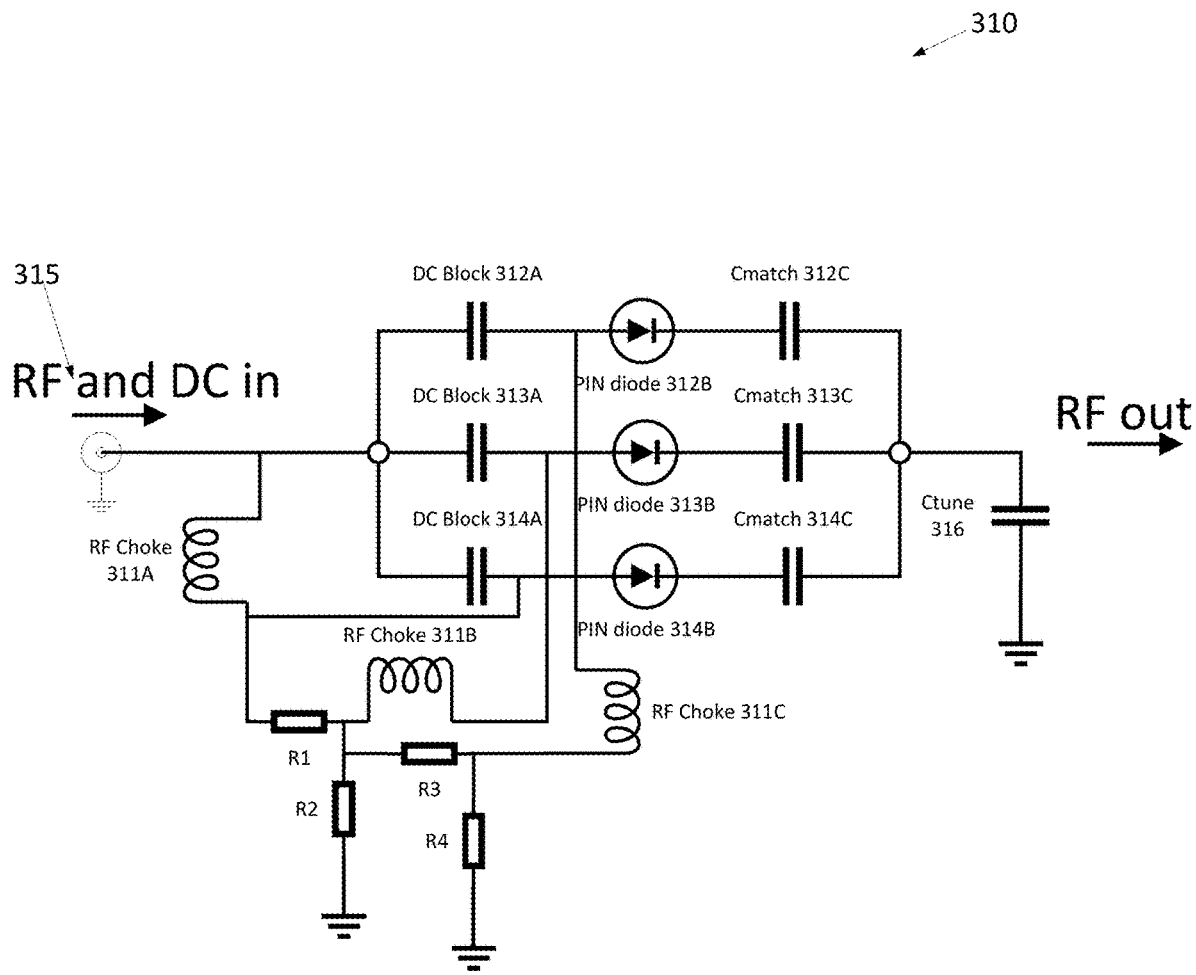
FIG. 3B shows an example of a matching capacitor bank configured provide matching to a transmit RF coil assembly.

Other than a tuning capacitor bank that can dynamically adjust the resonating frequency of the transmit RF coil assembly when a slice-selecting RF pulse is being applied, implementations may also include a matching capacitor bank capable of transforming input impedance. The impedance transformation may take place at two places on a quadrature drive birdcage, or at one place a linear drive birdcage coil. Referring to FIG. 3B, a capacitor bank that includes multiple rows of capacitor arrangements may be selected via the placement of diodes in-line with the matching series capacitors.

In more detail, an example of a matching capacitor bank from FIG. 3B can include three rows of capacitor arrangements, namely, matching capacitor 312C serially coupled to diode 312B and DC block 312A in the first row, matching capacitor 313C serially coupled to diode 313B and DC block 313A in the second row, matching capacitor 314C serially coupled to diode 314B and DC block 314A in the third row. The three rows feed into tuning capacitor 316. Diodes 312B, 313B, and 314B are variably coupled to a voltage divider network through RF choke 311C, RF choke 311B, and RF choke 311A. The voltage divider network includes resistors R1 through R4. As illustrated in FIG. 3B, input 315 provides the matching capacitor bank 310 with both the RF input and the DC input. RF chokes 311A through 311C coupled to voltage divider network at various locations serve to block the RF input while feeding DC bias respectively to diodes 314B, 313B, and 312B. Indeed, such arrangements form a 'bias-T' network in the matching circuit that allows power cables to carry both RF and DC voltages into the RF coil, thereby minimizing parasitic interaction between biasing and power cables.

Either the tuning circuit or matching circuit may be used to achieve the bandwidth requirements. A combination of both may also be used to further this objective. Therefore, several embodiments are presented here. Additionally, other circuits can be constructed with this method to achieve a wider bandwidth, therefore the embodiments illustrated in FIGS. 3A and 3B are not limiting. Indeed, a person of reasonable skill in the art can appreciate several different methods for driving the diodes including, for example, different or series capacitor matching methods.

While varactor diodes may provide variable capacitance with the application of a DC voltage, large swing voltages in an RF transmit coil seen during transmission phases of an MR imaging sequence may be beyond the handling capabilities of these varactor diodes. In other words, the active hot-switch approach as disclosed herein may not employ varactor diodes because of the large swing voltages.

The active hot-switch approach maintains the transmission efficiency of handling RF excitation pulses including slice-selecting RF pulses while preserving the homogeneity of the transmit field, sometimes known as Bi homogeneity without applying pulses of longer durations to increase flip angle. Indeed, the active hot-switch approach represents an advantage in maintaining the transmit field homogeneity compared to other approaches such as multi-tuned RF coils that utilize specialized structures resonating at multiple frequencies corresponding to the Larmor frequency of precession for different nuclei.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method for operating a magnetic resonance (MRI) system to image a portion of a subject placed in a volume of magnetic field generated by a main magnet of the MRI system, the method comprising:
    applying, at a transmit radio frequency (RF) coil assembly, a first slice-selecting RF pulse to the portion of the subject placed in a region of the volume to select a first slice while selectively adjusting multiple capacitor banks of a transmit coil assembly to improve RF characteristics of the transmit RF coil assembly in transmitting the first slice-selecting RF pulse;
    in response to the first slice-selecting RF pulse, acquiring first magnetic resonance (MR) signals emitted from the selected first slice of the portion of the subject placed in the region of the volume; and
    reconstructing a first MR image based on the acquired first MR signals,
    wherein one of: the RF characteristics of the RF transmit coil assembly is improved by virtue of a resonant frequency of the transmit RF coil assembly being adjusted to more closely match a resonant frequency of the first slice; and the RF characteristics of the RF transmit coil assembly is improved by virtue of an impedance of the transmit RF coil assembly being adjusted at the resonant frequency of the first slice.

2. The method of claim 1, further comprising: providing perturbations to the volume of magnet field such that the first MR signals encode the first MR image in accordance with the provided perturbations.

3. The method of claim 2, wherein the first slice-selecting RF pulse is synchronously applied along with the perturbations to the volume of magnet field and wherein the first the first MR signals are subsequently received.

4. The method of claim 3, further comprising: actively switching at least one diode coupled to at least one of the multiple capacitor banks when the first slice-selecting RF pulse is synchronously applied at a frequency determined by where the first slice is located in the region of the volume.

5. The method of claim 4, wherein the at least one diode is actively switched to adjust a resonant frequency of the transmit RF coil assembly, and wherein actively switching the at least one diode comprises: actively switching from on to off, or actively switching from off to on.

6. The method of claim 4, further comprising: generating a respective DC voltage for each DC biasing circuit coupled to one or more tuning capacitor banks in the multiple capacitor banks.

7. The method of claim 6, further comprising: applying the respective DC voltage to selectively switch a corresponding diode coupled to the one or more tuning capacitor banks without individually biasing each tuning capacitor bank.

8. The method of claim 1, further comprising: presenting the reconstructed first MR image to an operator.

9. The method of claim 1, further comprising:
applying, at a transmit RF coil assembly, a second slice-selecting RF pulse to the portion of the subject placed in the region of the volume to select a second slice while selectively adjusting multiple capacitor banks of the transmit coil assembly to improve RF characteristics of the transmit RF coil assembly in transmitting the second slice-selecting RF pulse;
in response to the second slice-selecting RF pulse, acquiring second magnetic resonance (MR) signals emitted from the selected second slice of the portion of the subject placed in the region of the volume; and
reconstructing a second MR image based on the acquired second MR signals.

10. The method of claim 9, wherein the RF characteristics of the RF transmit coil assembly is improved by virtue of a resonant frequency of the transmit RF coil assembly being adjusted to more closely match a resonant frequency of the second slice.

11. The method of claim 9, wherein the RF characteristics of the RF transmit coil assembly is improved by virtue of an impedance of the transmit RF coil assembly being adjusted at a resonant frequency of the second slice.

12. The method of claim 9, further comprising: providing perturbations to the volume of magnet field such that the second MR signals encode the second MR image in accordance with the provided perturbations.

13. The method of claim 12, wherein the second slice-selecting RF pulse is synchronously applied along with the perturbations to the volume of magnet field and wherein the second response MR signals are subsequently received.

14. The method of claim 13, further comprising: actively switching at least one diode coupled to at least one of the multiple capacitor banks when the second slice-selecting RF pulse is synchronously applied at a frequency determined by where the second slice is located in the region of the volume.

15. The method of claim 14, wherein the at least one diode is actively switched to adjust a resonant frequency of the transmit RF coil assembly, and wherein actively switching the at least one diode comprises: actively switching from on to off, or actively switching from off to on.

16. The method of claim 15, further comprising: generating a respective DC voltage for each DC biasing circuit coupled to one or more tuning capacitor banks in the multiple capacitor banks.

17. The method of claim 16, further comprising: applying the respective DC voltage to selectively switch a corresponding diode coupled to the one or more tuning capacitor banks without individually biasing each tuning capacitor bank.

18. The method of claim 9, further comprising: presenting the reconstructed second MR image to an operator.

* * * * *